United States Patent
Disney

(10) Patent No.: US 8,268,697 B2
(45) Date of Patent: Sep. 18, 2012

(54) SILICON-ON-INSULATOR DEVICES WITH BURIED DEPLETION SHIELD LAYER

(75) Inventor: Donald R. Disney, Cupertino, CA (US)

(73) Assignee: Monolithic Power Systems, Inc., San Jose, CA (US)

( * ) Notice: Subject to any disclaimer, the term of this patent is extended or adjusted under 35 U.S.C. 154(b) by 295 days.

(21) Appl. No.: 12/728,058

(22) Filed: Mar. 19, 2010

(65) Prior Publication Data

US 2011/0227191 A1    Sep. 22, 2011

(51) Int. Cl.
*H01L 21/00* (2006.01)
(52) U.S. Cl. .............. 438/420; 438/430; 438/197
(58) Field of Classification Search ............ 438/420, 438/430, 197
See application file for complete search history.

(56) References Cited

U.S. PATENT DOCUMENTS

| | | | | |
|---|---|---|---|---|
| 5,843,796 A | * | 12/1998 | Disney | 438/133 |
| 5,910,668 A | * | 6/1999 | Disney | 257/329 |
| 5,994,188 A | * | 11/1999 | Disney | 438/268 |
| 6,127,701 A | * | 10/2000 | Disney | 257/338 |
| 6,501,130 B2 | * | 12/2002 | Disney | 257/342 |
| 6,504,209 B2 | * | 1/2003 | Disney | 257/342 |
| 6,509,220 B2 | * | 1/2003 | Disney | 438/197 |
| 6,768,171 B2 | * | 7/2004 | Disney | 257/342 |
| 6,818,490 B2 | * | 11/2004 | Disney | 438/199 |
| 2003/0155613 A1 | * | 8/2003 | Hasegawa et al. | 257/347 |
| 2008/0057671 A1 | * | 3/2008 | Furukawa et al. | 438/426 |
| 2008/0142899 A1 | * | 6/2008 | Morris et al. | 257/371 |
| 2011/0227191 A1 | * | 9/2011 | Disney | 257/520 |
| 2012/0043608 A1 | * | 2/2012 | Yang et al. | 257/336 |

* cited by examiner

*Primary Examiner* — Laura Menz
(74) *Attorney, Agent, or Firm* — Perkins Coie LLP

(57) ABSTRACT

A silicon-on-insulator device with a with buried depletion shield layer.

1 Claim, 4 Drawing Sheets

US 8,268,697 B2

SILICON-ON-INSULATOR DEVICES WITH BURIED DEPLETION SHIELD LAYER

TECHNICAL FIELD

Embodiments of the present invention relate to electronic devices, and more particularly, to silicon-on-insulator devices.

BACKGROUND

Silicon-on-Insulator (SOI) wafers are used for the fabrication of some integrated circuits. An SOI wafer comprises a relatively thick semiconductor substrate or handle wafer, an insulating layer (buried oxide layer) disposed on top of the substrate, and a relatively thin semiconductor layer (SOI layer) disposed on top of the insulating layer. The insulating layer most often comprises silicon dioxide with a thickness in the range of 0.1 to 3.0 microns. The SOI layer is usually single-crystal silicon with a thickness in the range of 0.1 to 25 microns.

The SOI layer typically has a certain conductivity provided by doping the SOI layer with impurities of a given species and doping concentration. The SOI doping is usually the lowest doping required for one of the layers that is used to form the semiconductor devices in the SOI layer. Other device layers are formed by adding more dopant to certain regions of the SOI layer, the additional dopant overwhelming the background doping of the SOI layer. In a typical SOI CMOS process, for example, an Nwell region and a Pwell region may be formed in the SOI layer by introducing N-type and P-type dopants, respectively. Using conventional doping techniques, the well regions are diffused down from the surface of the SOI layer, such that they have their maximum doping concentration near the SOI layer surface, and have some vertical extent (junction depth) in the SOI layer. Typical junction depths for these well regions may be in the range of 1.0 to 5.0 microns. If the SOI layer thickness is less than the junction depth, then the well region extends down to the interface of the SOI layer and the buried oxide layer.

During normal operation, semiconductor devices formed in SOI layers are subject to potential differences between the well regions and the underlying semiconductor substrate. The substrate is typically biased to the lowest potential of the IC, while the well regions are biased to potentials that are the same or higher. If a Pwell is in contact with the top of the buried oxide layer, then the presence of this potential difference will cause an accumulation layer of holes to form in the Pwell at the interface of the SOI layer and buried oxide layer. If an Nwell is in contact with the top of the buried oxide layer, then the presence of this potential difference will cause an depletion layer to form in the Nwell, starting at the interface of the SOI layer and buried oxide layer and extending upward into the Nwell. Such depletion of an Nwell formed in an SOI layer can cause problems with circuit operation due to parasitic effects.

DETAILED DESCRIPTION

In the description that follows, the scope of the term "some embodiments" is not to be so limited as to mean more than one embodiment, but rather, the scope may include one embodiment, more than one embodiment, or perhaps all embodiments.

Figure 1:
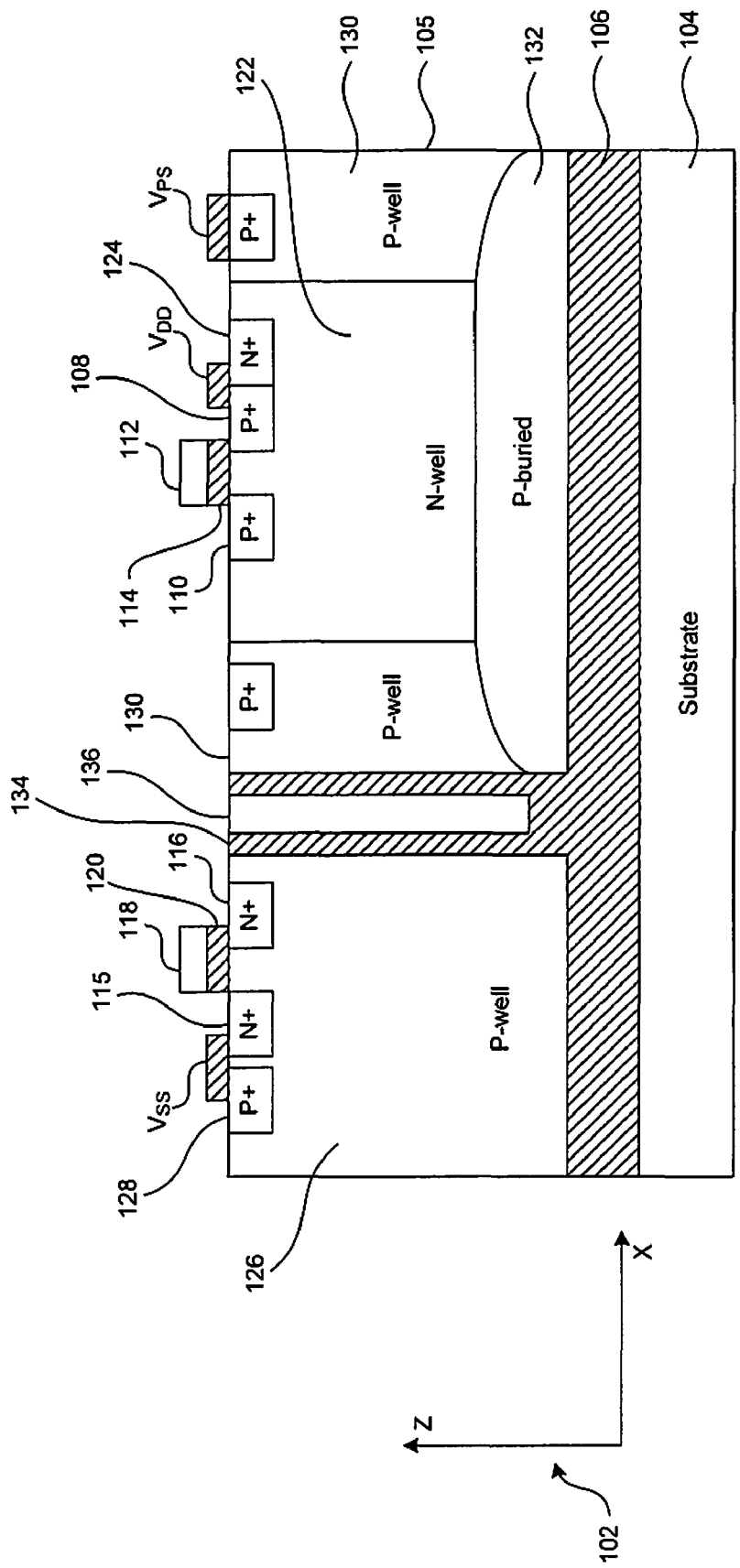
FIG. 1 illustrates a cross-sectional view of an embodiment.

FIG. 1 illustrates a simplified cross-section of an embodiment, where for ease of illustration the view is not drawn to scale. To provide a reference frame when describing another view of an embodiment, coordinate system 102 is illustrated, showing the x-axis and the z-axis lying in the plane of the illustration. The y-axis, not shown, points into the plane of the illustration. Illustrated in FIG. 1 are silicon-on-insulator (SOI) devices. Formed on substrate 104 is oxide layer 106 to insulate active devices formed in silicon layer 105 above oxide layer 106.

In the particular example of FIG. 1, a CMOS (complimentary-metal-oxide-semiconductor) process is used to fabricate an nMOSFET (n-type metal-oxide-semiconductor-field-effect-transistor) and a pMOSFET (p-type metal-oxide-semiconductor-field-effect-transistor) in the silicon layer 105. Illustrated in FIG. 1 is a pMOSFET comprising source region 108 (a p+ doped region), drain region 110 (a p+ doped region), and gate 112 formed on oxide 114; and an nMOSFET comprising source region 115 (an n+ doped region), drain region 116 (an n+ doped region), and gate 118 formed on oxide 120. The pMOSFET is formed in n-well 122, where n+ doped region 124 provides an ohmic body contact for the pMOSFET. Shown in FIG. 1 is a contact, denoted by $V_{DD}$, to provide electrical connection to source region 108 and body contact region 124. The nMOSFET is formed in p-well 126, where p+ doped region 128 provides an ohmic body contact for the nMOSFET. Shown in FIG. 1 is a contact, denoted by $V_{SS}$, to provide electrical connection to source region 115 and body contact region 128. For ease of illustration, not shown are contacts to drain region 116 for the nMOSFET and drain region 110 for the pMOSFET.

Surrounding n-well 122 are p-doped regions, indicated in FIG. 1 by the numeric labels 130 and 132. Note that the numeric label 130 appears twice, in a p-well region illustrated as lying to the left and right of n-well region 122. This p-well region is contiguous and surrounds n-well region 122, but because FIG. 1 represents a slice of an embodiment in the x-z plane (relative to coordinate system 102), this region is drawn as non-contiguous. P-well 130 may be formed using the same doping and diffusion steps that create P-well 126.

The region labeled 132 and denoted as "p-buried" in FIG. 1 is a p-doped region that lies below n-well 122, and is adjacent to oxide layer 106. For some embodiments, p-buried region 132 may be introduced by using high energy implantation. For some embodiments, p-buried region 132 may be implanted after the drive-in process for n-well 122 and p-well 130, thereby reducing the diffusion of the buried region. For such embodiments, a mask separate from the one used to form n-well 122 may be used. For other embodiments, p-buried region 132 may be implanted using the same photomask that is used for n-well 122, so that no additional masking layers are needed.

When a relatively negative voltage is applied to substrate 104, an accumulation layer of holes forms along the interface of p-buried region 132 and oxide layer 106. This accumulation layer of holes helps to shield n-well region 122 from unwanted depletion effects that may occur if p-buried region 132 was not present. For example, if N-well 122 (or another N-type layer) extended vertically to the top of oxide 106, then application of negative voltage on substrate 104 would cause a depletion region to form in N-well 122 above oxide 106.

In the particular embodiment of FIG. 1, p-well regions 126 and 130 are separated by a trench filled with oxide 134, in which conductor 136 is optionally formed. In some embodiments, conductor 136 is biased to the same potential as substrate 104. If a relatively negative voltage is applied to conductor 136, an accumulation layer of holes forms along the interface of p-well region 130 oxide layer 134. This accumulation layer of holes helps to shield n-well region 122 from unwanted depletion effects that may occur if p-well region 130 was not present. Before the trench is formed, p-well regions 126 and 130 may have been parts of the same p-well region, but these regions are shown as distinct regions in the illustration of FIG. 1 because of the trench. Some embodiments may not have such a trench.

Figure 2:
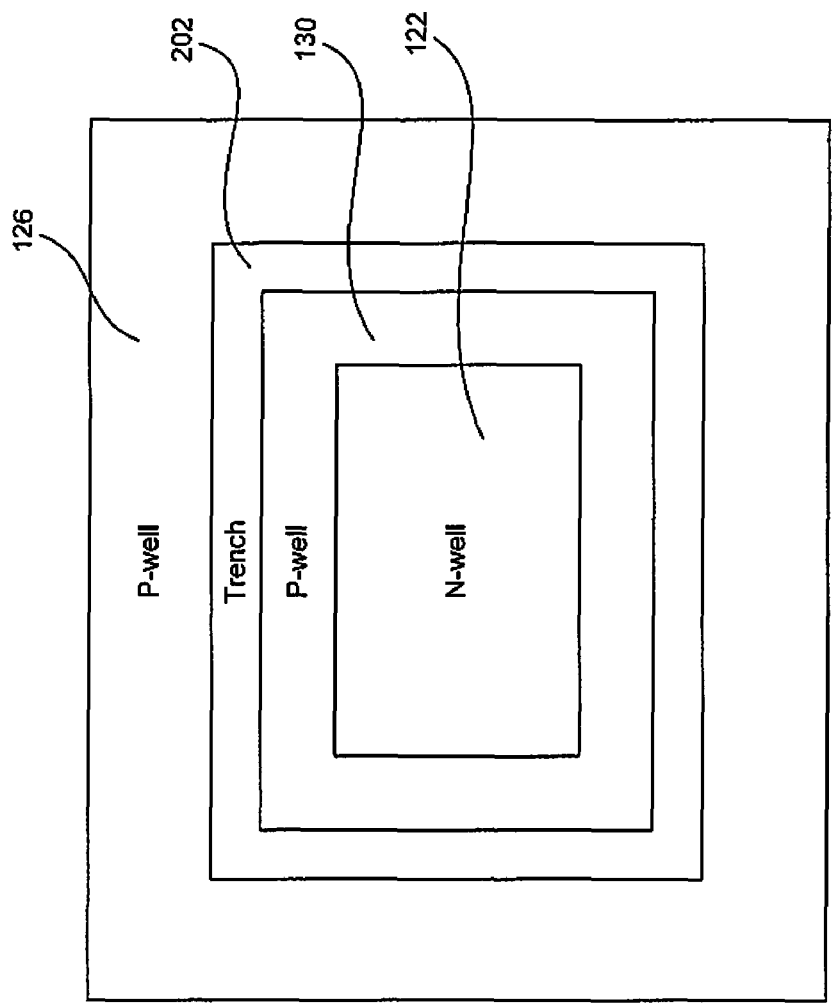
FIG. 2 illustrates a plan view of an embodiment

FIG. 2 illustrates an embodiment with a slice taken parallel to the x-y plane. This is indicated by illustrating coordinate system 102 in FIG. 2, but where now the y-axis and the x-axis are in the plane of the illustration, where the z-axis (not shown) is in a direction pointing out of the plane of illustration. For ease of illustration, the slice is not taken along the active layer, so that the MOSFETs are not shown, and conductor 136 is also not illustrated. Furthermore, the slice is not taken through p-buried region 132, so that this is not illustrated in FIG. 2. Also, the relative scale for FIG. 2 is not the same as that of FIG. 1. As illustrated in FIG. 2, trench 202 separates p-well region 130 from p-well region 126. Some embodiments may not include trench 202.

Figure 3:
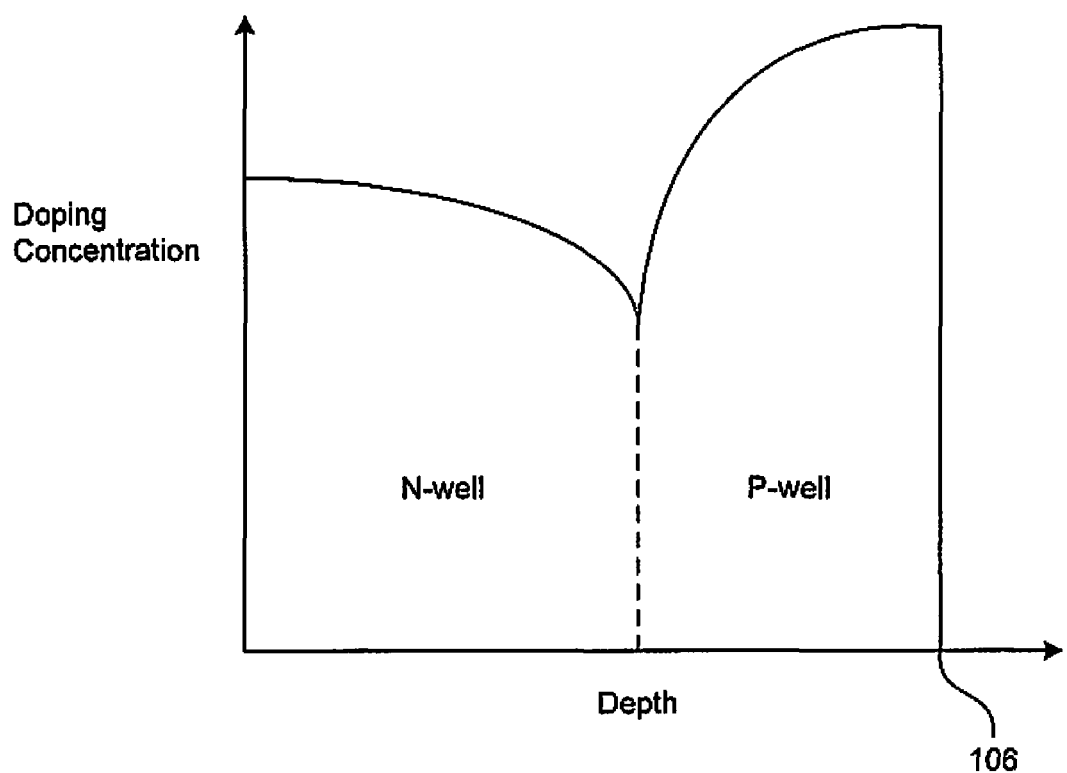
FIG. 3 illustrates the concentration gradients of an n-well and a p-well in an embodiment.

Because the high-energy implant used to form p-buried region 132 may be introduced after drive-in of n-well 122, for some embodiments the doping concentration for p-buried region 132 is higher than the doping concentration of n-well region 122. This is illustrated in FIG. 3, where doping concentration is plotted vs. depth (z-axis direction with respect to coordinate system 102). Label 106 in FIG. 3 indicates the depth position of the top of oxide layer 106 in FIG. 1. The plot in FIG. 3 is not necessarily drawn to any particular scale, but is meant to pictorially represent that, near the top of oxide 106, the doping concentration of p-buried region 132 exceeds the doping concentration of n-well region 122.

Figure 4:
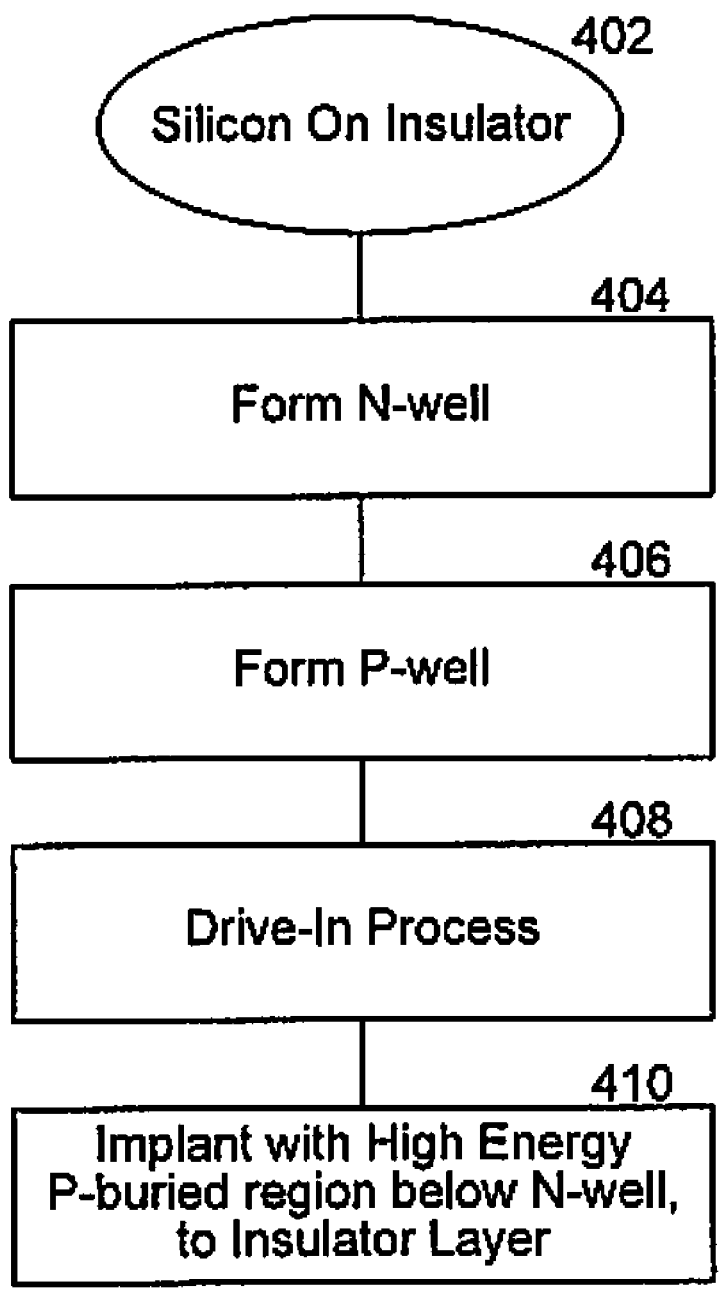
FIG. 4 illustrates a method according to an embodiment.

A process for an embodiment may be illustrated by the flow diagram of FIG. 4, where block 402 indicates a process of forming a silicon-on-insulator substrate. An n-well is formed in block 404, and for some embodiments, a p-well is formed in block 406. For some embodiments, the n-well and p-well may be completed by a drive-in process in block 408. In block 410, a p-buried region is formed under the n-well by high-energy implantation. The p-buried region reaches to the insulator (oxide) layer and has a doping concentration that is high enough to overcome the background concentration to form a p-type layer sandwiched between the oxide layer and the n-well. For some embodiments, block 410 may be performed before the drive-in process in block 408 so that the same mask may be used. For some embodiments, block 406 may not be included. That is, some embodiments may not include p-well region 130, which may be applicable in which only one n-well is needed on the silicon die.

Various modifications may be made to the disclosed embodiments without departing from the scope of the invention as claimed below.

I claim:

1. A method comprising:

forming an insulator layer over a substrate;

forming a first semiconductor layer over the insulator layer;

forming an n-well in said first semiconductor layer;

forming a p-well laterally adjacent to the n-well and in said first semiconductor layer;

diffusing the n-well and the p-well into the first semiconductor layer using a drive-in process; and implanting a p-type layer below the n-well and adjacent to the insulator after completion of the drive-in process;

forming a trench in the p-well, the trench surrounding the n-well and laterally separated from the n-well by a portion of the p-well, wherein the trench extends vertically from a top surface of the first semiconductor layer to a top surface of the insulator;

partially filling the trench with an insulating material; and filling the remainder of the trench with a conductive material.

* * * * *